(12) United States Patent
Yarnykh et al.

(10) Patent No.: US 7,627,359 B2
(45) Date of Patent: Dec. 1, 2009

(54) QUANTITATIVE CONTRAST ENHANCED BLACK-BLOOD IMAGING USING QUADRUPLE-INVERSION RECOVERY

(75) Inventors: Vasily L. Yarnykh, Seattle, WA (US); Chun Yuan, Bellevue, WA (US)

(73) Assignee: University of Washington, Seattle, WA (US)

( * ) Notice: Subject to any disclaimer, the term of this patent is extended or adjusted under 35 U.S.C. 154(b) by 582 days.

(21) Appl. No.: 11/385,201

(22) Filed: Mar. 21, 2006

(65) Prior Publication Data
US 2006/0184002 A1 Aug. 17, 2006

Related U.S. Application Data

(63) Continuation-in-part of application No. 10/740,354, filed on Dec. 18, 2003.

(60) Provisional application No. 60/435,835, filed on Dec. 19, 2002.

(51) Int. Cl.
*A61B 5/05* (2006.01)
(52) U.S. Cl. .................. 600/410; 324/307; 324/309
(58) Field of Classification Search ........... 600/410, 600/413; 324/306, 307, 309
See application file for complete search history.

(56) References Cited

U.S. PATENT DOCUMENTS

| | | | | |
|---|---|---|---|---|
| 5,051,698 A * | 9/1991 | Ordidge | ..................... | 324/309 |
| 5,256,967 A | 10/1993 | Foo et al. | ..................... | 324/311 |
| 5,588,431 A | 12/1996 | Mani et al. | ............... | 128/653.3 |
| 5,810,728 A * | 9/1998 | Kuhn | ..................... | 600/410 |
| 5,908,386 A | 6/1999 | Ugurbil et al. | .............. | 600/410 |
| 6,320,377 B1 | 11/2001 | Miyazaki et al. | ............ | 324/306 |
| 6,486,668 B1 * | 11/2002 | Ma | ............................ | 324/307 |
| 6,498,946 B1 * | 12/2002 | Foo et al. | ..................... | 600/410 |
| 7,412,277 B1 * | 8/2008 | Saranathan et al. | ......... | 600/413 |
| 7,546,155 B2 * | 6/2009 | Foo et al. | ..................... | 600/410 |
| 2002/0087070 A1 | 7/2002 | Foo et al. | ..................... | 600/420 |
| 2003/0062893 A1 | 4/2003 | Overall | ..................... | 324/306 |
| 2004/0101969 A1 * | 5/2004 | Viglianti et al. | ............. | 436/173 |

OTHER PUBLICATIONS

Bonk, Schmiedl, Yuan, Nelson, Black, and Ladd. "Time-of-Flight MR Angiography With Gd-DTPA Hexamethylene Diamine Co-Polymer Blood Pool Contrast Agent: Comparison of Enhanced MRA and Conventional Angiography for Arterial Stenosis Induced in Rabbits." *Journal of Magnetic Resonance Imaging*, 11:638-646 2000. © 2000 Wiley-Liss, Inc.

(Continued)

*Primary Examiner*—Long V Le
*Assistant Examiner*—Nigel Fontenot
(74) *Attorney, Agent, or Firm*—Ronald M. Anderson (57) ABSTRACT

A reduced field-of-view (FOV) imaging technique combines suppression of signals from outer volume and inflowing blood. Both outer volume and blood suppression are achieved using an SFQIR (Small-FOV Quadruple-inversion-Recovery) preparative pulse sequence including two double-inversion pulse pairs separated by appropriate delays. Within each pair, inversion pulses are successively applied to the imaged slice and the slab orthogonal to the imaging plane, with the thickness equal to the FOV size in the phase-encoding direction. Each double-inversion results in a reinversion of the magnetization in a central part of the FOV, while outer areas of the FOV and inflowing blood remain inverted. The SFQIR module was implemented for single-slice and multislice acquisition with a fast spin-echo readout sequence. Timing parameters of the sequence corresponding to the maximal suppression efficiency can be found by minimizing variation of the normalized signal over the entire range of $T_1$ occurring in tissues.

21 Claims, 6 Drawing Sheets

OTHER PUBLICATIONS

Cai, Hatsukami, Ferguson, Small, Polissar, and Yuan. "Classification of Human Carotid Atherosclerotic Lesions With In Vivo Multicontrast Magnetic Resonance Imaging." *Circulation, Journal of the American Heart Association*, Sep. 10, 2002, pp. 1368-1373.

Chu, Kampschulte, Ferguson, Kerwin, Yarnykh, O'Brien, Polissar, Hatsukami, and Yuan. "Occurrence and Staging of Hemorrhage in the Advanced Carotid Atherosclerotic Plaque: An In-Vivo Multi Contrast High Resolution MRI Study." Submitted to *Stroke*, Oct. 2003. 25pp.

Han and Yuan. "Plaque Morphological Quantitation." *Angiography and Plaque Imaging, Advanced Segmentation Techniques*. Chapter 2. Jasjit Suri and Swamy Laxminarayan, Eds. The Biomedical Engineering Series, Michael Neuman, Series Ed. CRC Press, Boca Raton, FL. Chapter 2. pp. 43-76.

Han, Hatsukami, and Yuan. "A Multi-Scale Method for Automatic Correction of Intensity Non-Uniformity in MR Images." *Journal of Magnetic Resonance Imaging*, 13:428-436 (2001). © Wiley-Liss, Inc.

Han, Hatsukami, Hwang, and Yuan. "A Fast Minimal Path Active Contour Model." *IEEE Transactions On Image Processing*, vol. 10, No. 6, Jun. 2001. pp. 865-873.

Han, Kerwin, Hatsukami, Hwang, and Yuan. "Detecting Objects in Image Sequences Using Rule-Based Control in an Active Contour Model." *IEEE Transaction on Biomedical Engineering*, vol. 50, No. 6, Jun. 2003. pp. 705-710.

Hatsukami, Ross, Polissar, and Yuan. "Visualization of Fibrous Cap Thickness and Rupture in Human Atherosclerotic Carotid Plaque In Vivo With High-Resolution Magnetic Resonance Imaging." *Circulation, Journal of the American Heart Association*. Aug. 29, 2000. pp. 959-964.

Kaneko, Skinner, Raines, Yuan, Rosenfeld, Wight, and Ross. "Detection of dissection and remodeling of atherosclerotic lesions in rabbits after balloon angioplasty by magnetic-resonance imaging." *Coronary Artery Disease*, Diagnostic Methods, 2000, vol. 11 No. 8. pp. 599-606.

Kang, Polissar, Han, Lin, and Yuan. "Analysis of the Measurement Precision of Arterial Lumen and Wall Areas Using High-Resolution MRI." Measurement Precision of High-Resolution MRI. *Magnetic Resonance in Medicine*, 44:968-972 (2000).

Kerwin and Yuan. "Analysis And Visualization Of Atherosclerotic Plaque Composition By MRI." *Angiography and Plaque Imaging, Advanced Segmentation Techniques*. Chapter 7. Jasjit Suri and Swamy Laxminarayan, Eds. The Biomedical Engineering Series, Michael Neuman, Series Ed. CRC Press, Boca Raton, FL. Chapter 3. pp. 77-117.

Kerwin, Cai, and Yuan. "Noise and Motion Correction in Dynamic Contrast-Enhanced MRI for Analysis for Atherosclerotic Lesions." *Magnetic Resonance in Medicine*, 47:1211-1217 (2002). pp. 1211-1217.

Kerwin, Han, Chu, Xu, Luo, Hwang, Hatsukami, and Yuan. "A Quantitative Vascular Analysis System for Evaluation of Artherosclerotic Lesions by MRI." Medical Imaging Computing and Computer-Assisted Intervention—MICCAI 2001, 4th International Conference Utrecht, The Netherlands, Oct. 2001 Proceedings. Niessen and Viergever, Eds. 9pp.

Kerwin, Hooker, Spilker, Vicini, Ferguson, Hatsukami, and Yuan. "Quantitative Magnetic Resonance Imaging Analysis of Neovasculature Volume in Carotid Atherosclerotic Plaque." *Circulation, Journal of the American Heart Association*, Feb. 18, 2003, pp. 851-856.

Luo, Polissar, Han, Yarnykh, Kerwin, Hatsukami, and Yuan. "Accuracy and Uniqueness of Three In Vivo Measurements of Atherosclerotic Carotid Plaque Morphology With Black Blood MRI." *Magnetic Resonance in Medicine*, 50:75-82 (2003).

Miller and Yuan. "Atherosclerotic Plaque Imaging Techniques in Magnetic Resonance Images." *Angiography and Plaque Imaging, Advanced Segmentation Techniques*. Chapter 7. Jasjit Suri and Swamy Laxminarayan, Eds. The Biomedical Engineering Series, Michael Neuman, Series Ed. CRC Press, Boca Raton, FL. pp. 299-329.

Mitsumori, Hatsukami, Ferguson, Kerwin, Cai, and Yuan. "In Vivo Accuracy of Multisequence MR Imaging for Identifying Unstable Fibrous Caps in Advanced Human Carotid Plaques." *Journal of Magnetic Resonance Imaging*, 17:410-420 (2003).

Naghavi, Morteza et al. "From Vulnerable Plaque to Vulnerable Patient, A Call for New Definitions and Risk Assessment Strategies: Part I." *Circulation, Journal of the American Heart Association*, Oct. 7, 2003. pp. 1664-1672.

Naghavi, Morteza et al. "From Vulnerable Plaque to Vulnerable Patient, A Call for New Definitions and Risk Assessment Strategies: Part II." *Circulation, Journal of the American Heart Association*, Oct. 14, 2003. pp. 1772-1778.

Saam and Yuan. "Vascular Imaging." *Encyclopedia of Biomaterials and Biomedical engineering*. Oct. 2003. 26pp.

Saam et al. In Vivo Comparison of the Atherosclerotic Lesion Ipsilateral and Contralateral to the Side of Symptomatic Carotid Disease: A High-Resolution, Multi-Contrast Magnetic Resonance Imaging Study. Submitted to *Stroke*, Oct. 2003. 25pp.

Saam, Cai JM, Cai YQ, Ma, Xu, Polissar, Hatsukami, and Yuan. "Differences in Carotid Artery Atherosclerotic Lesion Characteristics from the Index- and Non-Index Side of Symptomatic Patients: A High-Resolution, Multi Contrast Magnetic Resonance Imaging Study." Submitted to *Stroke*, 2003. 19pp.

Schwartz, Hatsukami, and Yuan. "Molecular Markers, Fibrous Cap Rupture, and the Vulnerable Plaque, New Experimental Opportunities." *Circulation, Journal of the American Heart Association*, Sep. 14, 2001. pp. 471-473.

Song, Wright, Wolf, and Wehrli. "Multislice Double Inversion Pulse Sequence for Efficient Black-Blood MRI." *Magnetic Resonance in Medicine* 47:616-620 (2002) DOI 10.1002/mrm.10094.

Winn, Schmiedl, Reichenbach, Beach, Nghiem, Dimas, Daniel, Maravilla, and Yuan. "Detection and Characterization of Atherosclerotic Fibrous Caps with T2-Weighted MR." *AJNR Am J Neuroradiol* 19:129-134, Jan. 1998.

Xu, Hwang, and Yuan. "Segmentation of Multi-Channel Image with Markov Random Field Based Active Contour Model." © Kluwer Academic Publishers, The Netherlands 2002. Accepted Aug. 7, 2001. 11pp.

Yarnykh and Yuan. "High-Resolution Multi-Contrast MRI of the Carotid Artery Wall for Evaluation of Atherosclerotic Plaques." *Current Protocols in Magnetic Resonance Imaging*, Unit A1.4, Intracranial Arterial Disease. Supplement 11. 2003. 18pp.

Yarnykh and Yuan. "Multislice Double Inversion-Recovery Black-Blood Imaging With Simultaneous Slice Reinversion." *Journal of Magnetic Resonance Imaging*, 17:478-483 (2003).

Yarnykh and Yuan. "$T_1$-Insensitive Flow Suppression Using Quadruple Inversion-Recovery." *Magnetic Resonance in Medicine*. 48:899-905.

Yarnykh, Vasily L. "Pulsed Z-Spectroscopic Imaging of Cross-Relaxation Paramters in Tissues for Human MRI: Theory and Clinical Applications." *Magnetic Resonance in Medicine*, 47:929-939 (2002).

Yuan, Beach, Smith, and Hatsukami. "Measurement of Atherosclerotic Carotid Plaque Size in Vivo Using High Resolution Magnetic Resonance Imaging." *Circulation, Journal of the American Heart Association*. Dec. 15, 1998. pp. 2666-2671.

Yuan, Hatsukami, and O'Brien. "High-Resolution Magnetic Resonance Imaging of Normal and Atherosclerotic Human Coronary Arteries Ex Vivo: Discrimination of Plaque Tissue Components." *Journal of Investigative Medicine*, vol. 49, No. 6, Nov. 2001. pp. 491-499.

Yuan, Kerwin, Ferguson, Polissar, Zhang, Cai, and Hatsukami. "Contrast-Enhanced High Resolution MRI for Atherosclerotic Carotid Artery Tissue Characterization." *Journal of Magnetic Resonance Imaging*, 15:62-67 (2002).

Yuan, Lin, Millard, and Hwang. "Closed Contour Edge Detection of Blood Vessel Lumen and Outer Wall Boundaries in Black-Blood MR Images." *Magnetic Resonance Imaging*, vol. 17, No. 2, 1999. pp. 257-266.

Yuan, Miller, Cai, and Hatsukami. "Carotid atherosclerotic wall imaging by MRI." *Neuroimaging Clinics of North America*, 12 (2002). pp. 391-401.

Yuan, Mitsumori, Beach, and Maravilla. "Carotid Atherosclerotic Plaque: Noninvasive MR Characterization and Identification of Vulnerable Lesions." *Radiology*, vol. 221, No. 2, Nov. 2001. pp. 285-299.

Yuan, Mitsumori, Ferguson, Polissar, Echelard, Ortiz, Small, Davies, Kerwin, and Hatsukami. "In Vivo Accuracy of Multispectral Magnetic Resonance Imaging for Identifying Lipid-Rich Necrotic Cores and Intraplaque Hemorrhage in Advanced Human Carotid Plaques." *Circulation, Journal of the American Heart Association*, Oct. 23, 2001. pp. 2051-2056.

Yuan, Zhang, Polissar, Echelard, Ortiz, Davis, Ellington, Ferguson, and Hatsukami. "Identification of Fibrous Cap Rupture With Magnetic Resonance Imaging Is Highly Associated With Recent Transient Ischemic Attack or Stroke." *Circulation, Journal of the American Heart Association*, Jan. 15, 2002. pp. 181-185.

Yuan, Zhao, and Hatsukami. "Quantitative Evaluation of Carotid Atherosclerotic Plaques by Magnetic Resonance Imaging." *Currect Atherosclerosis Reports 2002*, vol. 4. © 2002 Current Science Inc. pp. 351-357.

Zhang, Cai, Luo, Han, Polissar, Hatsukami, and Yuan. "Measurement of Carotid Wall Volume and Maximum Area with Contrast-enhanced 3D MR Imaging: Initial Observations." *Radiology*, vol. 228, No. 1, Jul. 2003. pp. 200-205.

Zhang, Hatsukami, Polissar, Han, and Yuan. "Comparison of carotid vessel wall area measurements using three difference contrast-weighted black blood MR imaging techniques." *Magnetic Resonance Imaging*, 19 (2001) pp. 795-802.

Zhao, Yuan, Hatsukami, Frechette, Kang, Maravilla, and Brown. "Effects of Prolonged Intensive Lipid-Lowering Therapy on the Characteristics of Carotid Artherosclerotic Plaques In Vivo by MRI, A Case-Control Study." *Arterioscler Thromb Vasc Biol*. Oct. 2001. pp. 1623-1629.

\* cited by examiner

QUANTITATIVE CONTRAST ENHANCED BLACK-BLOOD IMAGING USING QUADRUPLE-INVERSION RECOVERY

RELATED APPLICATIONS

This application is a continuation-in-part of a copending patent application Ser. No. 10/740,354, filed on Dec. 18, 2003, which is based on U.S. provisional application, Ser. No. 60/435,835, filed on Dec. 19, 2002, the benefit of the filing dates of which is hereby claimed under 35 U.S.C. § 120 and 35 U.S.C. § 119(e).

GOVERNMENT RIGHTS

This invention was made with U.S. Government support under grant No. RO1 HL 56874 awarded by the National Institutes of Health (NIH). The U.S. Government has certain rights in the invention.

BACKGROUND

Restriction of a field-of-view (FOV) provides a number of advantages in magnetic resonance imaging (MRI) when imaging structures are disposed deeply within a subject's body and surrounded by a large volume of tissue. A reduction of the FOV in the phase-encoding direction can help to reduce scan time, avoid artifacts, and increase spatial resolution. Cardiovascular imaging may benefit from a reduction of the FOV, particularly in applications to the heart and carotid arteries.

Current techniques for reduced FOV imaging can be broadly grouped into two classes: preparative sequences for suppression of unwanted regions and selective excitation of the volume of interest. The first approach utilizes different spatial saturation schemes ranging from a single 90° pulse to multi-pulse, variable flip angle sequences. The second class of technical solutions for the FOV reduction includes the variants of inner volume imaging by using a spin-echo sequence, with excitation and refocusing pulses applied to orthogonal planes and two-dimensional (2-D) spatially selective excitation pulses. Each of these techniques has some limitations, which motivate the design of an alternative approach.

For example, spatial saturation is known to suffer from high sensitivity to RF in-homogeneity and poor performance for media with short $T_1$, although more complicated solutions based on a long train of low-flip-angle adiabatic pulses have demonstrated marked improvements. A spin-echo (or fast spin-echo (FSE)) sequence with orthogonal excitation and refocusing is incompatible with multislice acquisition, since refocusing pulses in such a sequence will inevitably saturate neighboring slices. This limitation makes this technique suitable only for a single-slice or three-dimensional (3-D) imaging. Spatially-selective 2-D RF pulses have an inherently periodic excitation profile with side lobes, which may excite the magnetization outside the observed FOV and produce aliasing artifacts, making the design of such pulses a complicated problem and imposing limitations on the degree of the FOV reduction dependent on the object size and pulse parameters. In addition, 2-D pulses are long and, therefore, sensitive to the effects of $T_2$ decay.

A specific feature of many cardiovascular applications is the need for effective blood suppression in MRI imaging, which can be achieved by employing a double-inversion-recovery (DIR) preparative sequence. In contrast, an alternative scheme utilizing saturation of inflowing blood frequently produces generally unsatisfactory results. It is also known that a classic DIR technique has a major drawback of being extremely time-inefficient, due to its inherent single-slice acquisition. Recently proposed multislice DIR methods appear to overcome this limitation, although their benefits become apparent only for long-repetition time (i.e., TR) applications, and their time performance is somewhat limited by the relatively long inversion delays and outflow requirements. Thus, a technique for reducing FOV would be desirable for improving the time efficiency of black-blood cardiovascular imaging in both single-slice and multislice implementations.

Accordingly, it would be desirable to develop a new approach for achieving reduced FOV imaging, which utilizes the principle of quadruple-inversion-recovery (QIR) and allows simultaneous suppression of unwanted signals originating from both the static parts of the object and inflowing blood. Initially developed for $T_1$ insensitive blood signal suppression as described in a commonly assigned copending U.S. patent application Ser. No. 10/740,354, filed on Dec. 18, 2003, QIR has a specific application for black-blood contrast-enhanced imaging. It would further be desirable to develop a more general preparative sequence for QIR, which would suppress outer volume and blood contributions into the signal and enable a multislice extension of the QIR method originally proposed for single-slice acquisition.

SUMMARY

One aspect of the subject matter described and claimed below is directed to a method for suppressing components of the magnetic resonance signal used for imaging a site in a subject. These components correspond to undesired portions of the site. The method includes the step of generating a sequence of radiofrequency (RF) pulses, where the total number of the RF pulses is an even number at least equal to four. The RF pulses are applied to the subject and are grouped into a plurality of double-inversion procedures. Each double-inversion procedure includes a first selective RF pulse that is targeted to select a first volume and a second selective RF pulse targeted to select a second volume that crosses and is generally transverse to the first volume. The first and second selective RF pulses in each double-inversion procedure are immediately adjacent to each other in time. The method further provides for delaying a first predefined time interval between one of the first and second selective RF pulses in one procedure and a corresponding one of the first and second selective RF pulses in a successive double-inversion procedure. For a double-inversion procedure that is selected to be the last before applying an acquisition sequence to acquire the signal used to produce an image, the method provides for delaying a second predefined time interval following the corresponding one of the first and the second selective RF pulses, before acquiring the signal that will be processed to produce the image of the site. As a result of delaying the first predefined time interval and the second predefined time interval, the components of the signal that are contributed by the undesired portions of the site are substantially suppressed when producing the image of the site.

The first volume of tissue can correspond to a slab of tissue at the site, while the second volume can be either a slice of tissue (i.e., having a thickness that is substantially thinner than that of the slab), or a plurality of slices that comprise another slab. In the latter case, it is possible to selectively image multiple slices of the other slab, so that a plurality of images are acquired during a repetition time that is employed to image the site.

The first and second predefined time intervals can be determined to achieve substantial signal suppression for a range of relaxation times $T_1$ occurring in tissues comprising the human body. An iterative optimization process using an appropriate algorithm, such as the Gauss-Newton minimization technique, can be employed for this determination.

Another aspect of this new development is directed to a preparative sequence of RF pulses used in suppressing components of a signal applied to image a site in a subject. The preparative sequence includes at least two pairs of double-inversion RF pulses. In a manner generally consistent with the method described above, a first RF pulse in each pair is targeted to select a first volume at the site, and a second RF pulse in each pair is targeted to select a second volume at the site. The first volume extends generally transversely across the second volume. A first predefined time delay is employed as an inversion time between one of the first and second RF pulses of one pair of the double-inversion RF pulses and a corresponding one of the first and second RF pulses in a successive pair of the double-inversion RF pulses. A second predefined time delay is applied as an inversion time after the one of the first and second RF pulses of a pair of double-inversion RF pulses that occurs just before acquiring the signal to image the site. The first and second predefined time delays are previously defined to optimally suppress an undesired contribution to the signal by a specific type of tissue at the site, such as any static tissue outside a desired portion of the site that is to be imaged, or blood flowing through the site.

Yet another aspect of this development is directed to a system for imaging a site in a subject wherein specific components of a signal acquired to image the site are suppressed. These specific components correspond to portions of the site that are undesired in an image of the site. The system includes apparatus adapted for producing an image of the site, and a computer coupled to the apparatus to control it. The computer includes a memory in which machine instructions are stored, and a processor coupled to the memory. The processor executes the machine instructions to control the apparatus to carry out a sequence of operations that are generally consistent with the steps of the method discussed above.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein.

DESCRIPTION

Figures and Disclosed Embodiments are Not Limiting

Exemplary embodiments are illustrated in referenced Figures of the drawings. It is intended that the embodiments and Figures disclosed herein are to be considered illustrative rather than restrictive.

SFQIR Pulse Sequence

Figure 1:
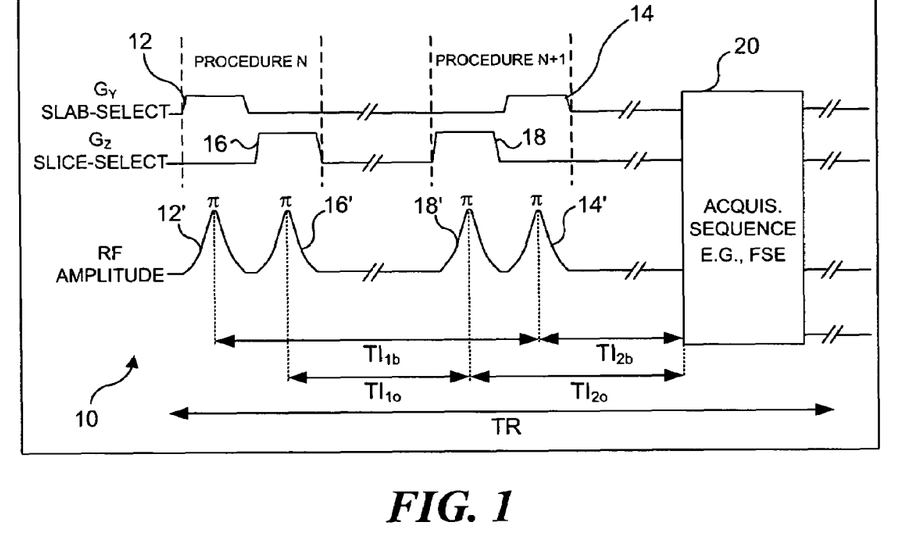
FIG. 1 is a diagram of an SFQIR preparative pulse sequence.

A timing diagram 10 of the preparative pulse sequence developed in an exemplary approach discussed in greater detail below is shown in FIG. 1. Referring to the illustrated exemplary prototype QIR sequence, the new preparative scheme is referred to herein as "small-field-of-view QIR" (SFQIR). In an exemplary implementation of the present approach, the SFQIR preparation precedes an acquisition sequence 20, e.g., a standard FSE readout sequence. However, it will be understood that the use of FSE for acquiring a signal usable to produce an image of a desired region at a site is not intended to be limiting on the present approach, since other appropriate techniques can be employed instead for this purpose. The SFQIR sequence in this exemplary embodiment preferably includes two double-inversion pulse pairs (i.e., wherein the first double-inversion pulse pair is identified as a "procedure N," and the second double-inversion pulse pair is identified as a "procedure N+1"), followed by corresponding inversion times. Within each double-inversion pulse pair, inversion pulses are applied in two orthogonal planes corresponding to the imaged slice and the slab with the thickness equal to the FOV size in the phase-encoding direction. Specifically, a slab-select pulse 12 is applied as the first pulse of the pair in procedure N, while a slab-select pulse 14 is applied as the second pulse of the pair in procedure N+1. Similarly, a slice-select pulse 16 is applied as the second pulse of the pair in procedure N, while a slice-select pulse 18 is applied as the first pulse of the pair in procedure N+1. The corresponding RF amplitudes for these pairs of pulses are indicated at 12', 16', 18', and 14', where each pulse is assumed to produce a π (i.e., 180°) flip angle. Successive application of these pairs of pulses in the two procedures results in the reinversion of the magnetization in the central part of the FOV, while the magnetization of the outer areas of the FOV (i.e., the portion of the site that is not in the desired region being imaged), and the orthogonal volume containing inflowing blood, such as in a vessel 60, experience non-compensated inversions.

Figure 2:
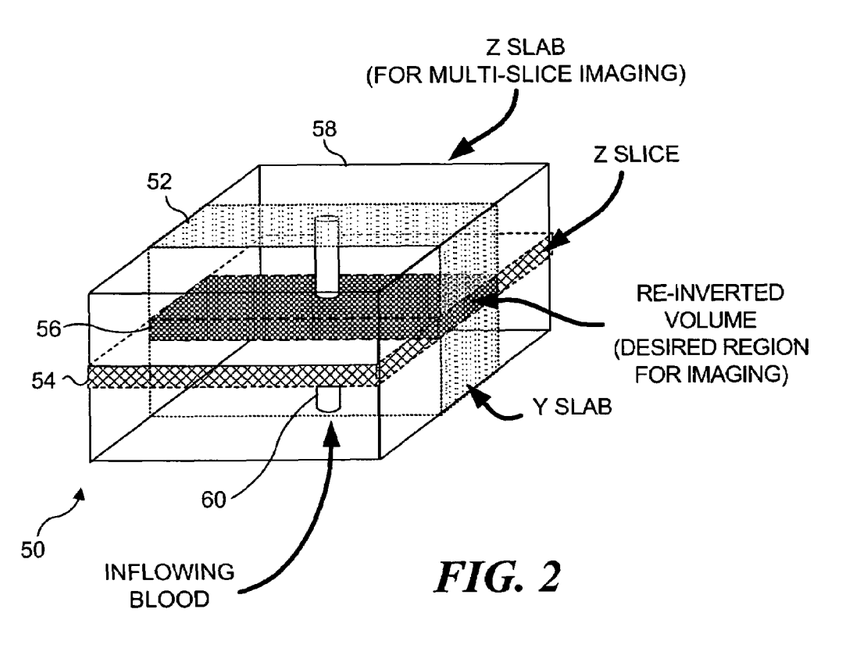
FIG. 2 is a schematic representation of geometric relations between inversion planes in the SFQIR sequence.

Geometric relationships 50 of the different volumes of tissue comprising the inversion planes are schematically shown in FIG. 2. As shown in this Figure, the slab-select pulse selects a slab 52 (oriented in the Y plane of the Figure), while the slice-select pulse selects a slice 54, which is oriented in the Z plane of the Figure, generally transversely crossing or orthogonal to slab 52. Slices are substantially thinner than slabs. It should be understood that the slab and slice that are selected in this approach need not be orthogonal, so long as they cross each other transversely. The intersection of slab 52 and slice 54 defines a desired region 56 that is the re-inverted volume (after the two pairs of double-inversion pulses have been applied, as discussed above in connection with FIG. 1). This desired region will be the portion of the image that is of interest when the signal is acquired after the pairs of double-inversion pulses have been applied. As a further alternative, another slab 58 can be selected for multislice imaging, if desired. Slab 58 is also oriented generally in the Z plane of the figure and comprises a plurality of slices (e.g., including slice 54) which can be selectively processed to acquire a signal to produce an image of each selected slice, specifically having a re-inverted volume, generally like that shown for desired region 56.

It is important to note that inversion times for the outer part of the FOV and for the inflowing blood are different because of a generally non-negligible duration of inversion pulses. These inversion times are denoted in FIG. 1 as $TI_{1o}/TI_{2o}$ for the outer FOV part (i.e., for tissue that is in a selected slice or in a selected slab, but outside the desired region), and $TI_{1b}/TI_{2b}$ for blood flowing through the site being imaged. The relations between inversion times for blood and for the tissue outside the desired region are:

$$TI_{1b}=TI_{1o}+2\delta \text{ and } TI_{2b}=TI_{2o}-\delta$$

where $\delta$ is the delay corresponding to the width of an inversion pulse and ramp times of the Z-slice and Y-slab selection gradients. It should further be understood that the above-identified relations are specific to the particular order of inversion pulses shown in FIG. 1, and for different inversion pulse configurations, different formulas would apply to relate inversion times $TI_{1o}/TI_{2o}$ and $TI_{1b}/TI_{2b}$.

The SFQIR sequence can be implemented in single-slice and multislice modes. In the single-slice mode, the sequence shown in FIG. 1 is executed for each slice sequentially with a period equal to TR, i.e., the time to repeat, for the imaging system being used. In the multislice mode, slice-selective inversions (Z-gradient) are replaced by slab-selective ones and applied to the whole imaging volume composed of all slices to be imaged. This preparative sequence is executed before a readout module (e.g., FSE) for each slice. The entire imaging sequence (preparation followed by FSE or other type of acquisition) for each slice is executed within the time equal to $TR/N_s$, where $N_s$ is the number of slices to be imaged, which facilitates imaging a group of slices within a TR interval, if TR is sufficiently long. Of note, the behavior of magnetization for single-slice and multislice modes requires different mathematical models, as discussed below.

Theoretical Analysis

To develop a theoretical model for the suppression effect produced by the combination of the SFQIR preparative module and the FSE (or other) readout sequence, the action of the sequence needs to be separately considered for the following two regions of the object:

1. Outer areas of the FOV (referred to herein as the "outer volume") are subjected to two inversions and all pulses of the FSE readout sequence. The entire sequence of RF pulses and delays repeated within each TR period can be schematically presented as:

$$180°-TI_{1o}-180°-TI_{2o}-90°-(\tau-\beta°-\tau)N-T_{Do},$$

where N is the echo train length (ETL); the echo spacing is equal to $2\tau$; refocusing pulses have a flip angle $\beta$; and $T_{Do}$ is the delay time from the last echo to the end of TR, where $T_{Do}=TR-2N\tau-TI_{1o}-TI_{2o}$.

2. Inflowing blood within the Y-slab is periodically inverted, with delays between inversion pulses $TI_{1b}$ and $TR-TI_{1b}$, as follows:

$$180°-TI_{1b}-180°-T_{Db},$$

where $T_{Db}=TR-TI_{1b}$.

The preparatory sequence acting on the outer volume is in fact a dual-inversion multi-echo sequence. An analysis for this sequence was recently presented, assuming the ideal case of excitation and refocusing pulses with flip angles of 90° and 180°, respectively. However, modern implementations of an FSE sequence frequently use refocusing pulses different than 180° to maximize echo signal and/or reduce deposited RF power. To provide the correct analysis for such cases, a more general description of the multi-echo sequence was applied, which accommodates an arbitrary flip angle $\beta$ of refocusing pulses, as is known in the art. In the following discussion, magnetization equations are presented for the longitudinal magnetization immediately before the excitation pulse, which is proportional to the measured signal. For the outer volume, $$M_{zo}=1-F\exp(-(TR-2N\tau)/T_1)-2\exp(-TI_{2o}/T_1) \quad [1]$$
$$[1-\exp(-TI_{1o}/T_1)]$$

where:

$$F=[(\cos\beta)^N E^{2N}(1-E)(1+E\cos\beta)+E(1-\cos\beta)]/ \quad [2]$$
$$[1-E^2\cos\beta]$$

with E defined as $E=\exp(-\tau/T_1)$. In Eq. [1] and below, it is presumed that the magnetization is normalized to its equilibrium value. Of note, this theoretical model is based on two key assumptions. First, the excitation pulse is assumed to have an ideal 90° excitation profile that permits equating the longitudinal magnetization to zero, after this pulse. Second, the transverse magnetization is assumed to be completely dephased (i.e., to be equal to zero) at the center of each refocusing pulse, which limits the analysis to the buildup of the longitudinal magnetization during the echo train, regardless of the behavior of transverse components. In practice, the last assumption can be fulfilled by applying "Z-crushers" around refocusing pulses, which is a standard design technique in multi-echo sequences.

A multislice variant of the SFQIR sequence requires special consideration. The sequence of RF pulses and delays affecting the magnetization of the outer volume for a particular slice within each TR interval can be presented as follows:

$$180°TI_{1o}-180°-TI_{2o}-90°-(\tau-\beta°-\tau)N-T_{D1o}-$$
$$(180°TI_{1o}-180°-T_{D2o})(N_s-1)$$

where $T_{D1o}=TR/N_s-2N\tau-TI_{1o}-TI_{2o}$, and $T_{D2o}=TR/N_s-TI_{1o}$. The outer volume experiences one repetition of the FSE sequence and $N_s$ repetitions of a dual-inversion preparative sequence per TR. There are also two delays, i.e., the post-acquisition delay $T_{D1o}$ is applied once per TR when the particular slice is imaged, and a longer delay $T_{D2o}$ is applied $N_s-1$ times when the FSE imaging sequence is applied to other slices. Consecutive solution of Bloch equations for the above pulse sequence results in the following expression for the longitudinal magnetization before the 90° excitation pulse:

$$M_{zo}=1-F\exp(-(TR-2N\tau)/T_1)-2\exp(-TI_{2o}/T_1) \quad [3]$$
$$[1-\exp(-TI_{1o}/T_1)]\times[1-\exp(-TR/T_1)]/$$
$$[1-\exp(-TR/(N_sT_1))]$$

where F is given by Eq. [2]. Clearly, Eq. [1] represents a particular case of Eq. [3] applicable to a single-slice acquisition (i.e., where $N_s=1$).

The behavior of the blood magnetization periodically inverted within the Y-slab is identical to that in the QIR pulse sequence and can be described by the equation:

$$M_{zh} = 1 - 2\exp(-TI_{2b}/T_1)[1-\exp(-TI_{1b}/T_1)]/[1-\exp(-TR/(N_sT_1))] \quad [4]$$

Eq. [4] is valid for both single-slice and multislice SFQIR. In the latter variant, the repetition period for pulses acting on the blood magnetization is $TR/N_s$ instead of TR.

Optimization of Inversion Times

To find optimal inversion times of the SFQIR sequence providing the maximal suppression efficiency for maximally suppressing the contribution to an image due to the tissue outside the desired region, or maximally suppressing the contribution to an image of the desired region due to flowing blood, the search of inversion times was formulated as a minimization problem. It should be understood, that if the optimal inversion times are selected to maximally suppress the outer volume, blood suppression will not be maximized and vice versa. Since the suppression effect of the SFQIR preparation is determined by $T_1$, and a variety of $T_1$ times is expected in tissues, the optimization should be applied to the entire range of physiologically reasonable $T_1$ values. Suppression efficiency can be described by the integral:

$$\Psi = \int_{T_1^{min}}^{T_1^{max}} (M_{zo}/M_z^{FSE})^2 \, dT_1 \quad [5]$$

where the denominator of the integrand represents a signal available for the FSE sequence with identical parameters and without SFQIR preparation:

$$M_z^{FSE} = 1 - F\exp(-(TR-2N\tau)/T_1) \quad [6]$$

and $M_{zo}$ is given by Eq. [3]. The minimum of the integral $\Psi$ corresponds to the maximal suppression efficiency over the chosen $T_1$ range limited by $T_1^{min}$ and $T_1^{max}$. Thus, optimal inversion times $TI_{1o}$ and $TI_{2o}$ can be found by numerical minimization of the integral $\Psi$ with other sequence parameters (i.e., TR, $\tau$, N, $\beta$, and $N_s$) fixed.

As noted above, the described procedure can be used to optimize suppression of either the outer volume (using Eq. [3]), or blood (using Eq. [4]). In the latter case, the denominator given by Eq. [6] is equal to one, assuming that inflowing blood has the fully relaxed magnetization, and the algorithm is identical to that described for the QIR method. Although more complicated optimization strategies based on minimization of a weighted combination of both the outer volume and blood signal equations are also possible, this exemplary embodiment targets the optimization procedure entirely to the outer volume suppression problem. This approach presumes that the maximal efficiency of suppression has to be achieved for stationary tissues as the dominant requirement for the performance of any reduced FOV method, while the blood suppression conditions can be theoretically suboptimal. However, it is contemplated that optimal solutions for suppressing the blood signal can instead be determined in an analogous manner. In some applications, it may be more important to optimally suppress the contribution to an image due to flowing blood, rather than that due to the outer tissue volume.

An algorithm for searching the optimal inversion times was implemented using custom C language software. The algorithm employs a Gauss-Newton minimization of the sum of squares, which approximates the integral $\Psi$ with a discretization step of 1 ms. The optimization procedure demonstrated fast and stable convergence in 3-4 iterations for any physically reasonable set of sequence parameters. All inversion times used for simulations and experiments described below were generated using the above algorithm, with settings $T_1^{min}=100$ ms and $T_1^{max}=2500$ ms.

MRI Experiments

The SFQIR-FSE sequence was implemented for a 1.5 T whole-body MRI scanner (Signa Horizon EchoSpeed 5.8, General Electric, Milwaukee, Wis.). All inversion pulses were adiabatic with a hyperbolic-secant shape and a duration of about 8.6 ms. The FSE readout sequence employed a train of refocusing pulses with a flip angle $\beta=160°$.

The efficiency of outer volume suppression was tested with a phantom containing media with different relaxation properties: 1.0 and 0.2 mM solutions of gadolinium, with $T_1=203$ and 754 ms, respectively, prepared by diluting a commercial contrast agent (Omniscan™, which is available from Nycomed, Princeton, N.J.), 0.3 mM solution of $MnCl_2$ ($T_1=448$ ms), corn oil ($T_1=246$ ms), and water ($T_1=2570$ ms). The above $T_1$ values cover the entire range of $T_1$ expected in biologic tissues, including contrast-enhanced experiments.

In vivo images were obtained from four healthy subjects (male, ages 25-34) and one patient with carotid atherosclerosis (a female, age 67). In three healthy subjects, the SFQIR sequence was tested for imaging of the abdomen and chest, with the focus on the abdominal and thoracic aorta. In the other two subjects, the method was used for black-blood imaging of cervical carotid arteries. Informed consent was obtained from all participants. Body and neck imaging was performed using custom-made, four-element phased-array coils of appropriate diameter. Detailed specifications of scan parameters are given in corresponding descriptions for the Figures.

Theoretical and Experimental Validation

Figure 3A:
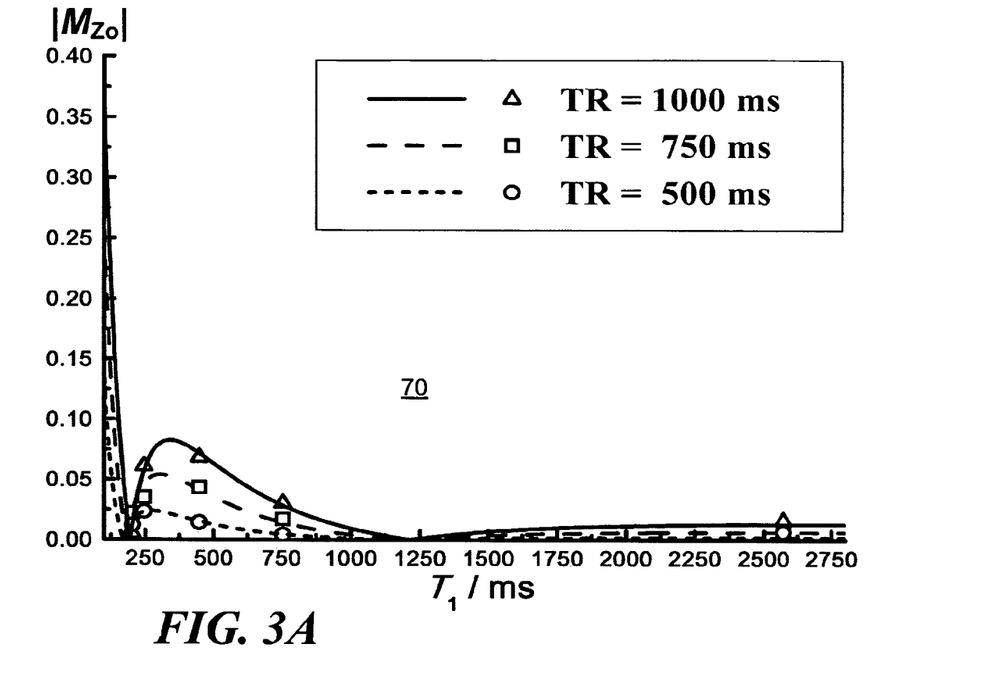
FIGS. 3A and 3B respectively illustrate theoretical and experimental evaluation of outer volume suppression by the SFQIR-FSE sequence in the single mode (FIG. 3A) and multislice mode (FIG. 3B), wherein for each curve, inversion times were optimized, and theoretical $M_{zo}$ values were simulated, and their absolute values are plotted as functions of $T_1$.
Figure 3B:
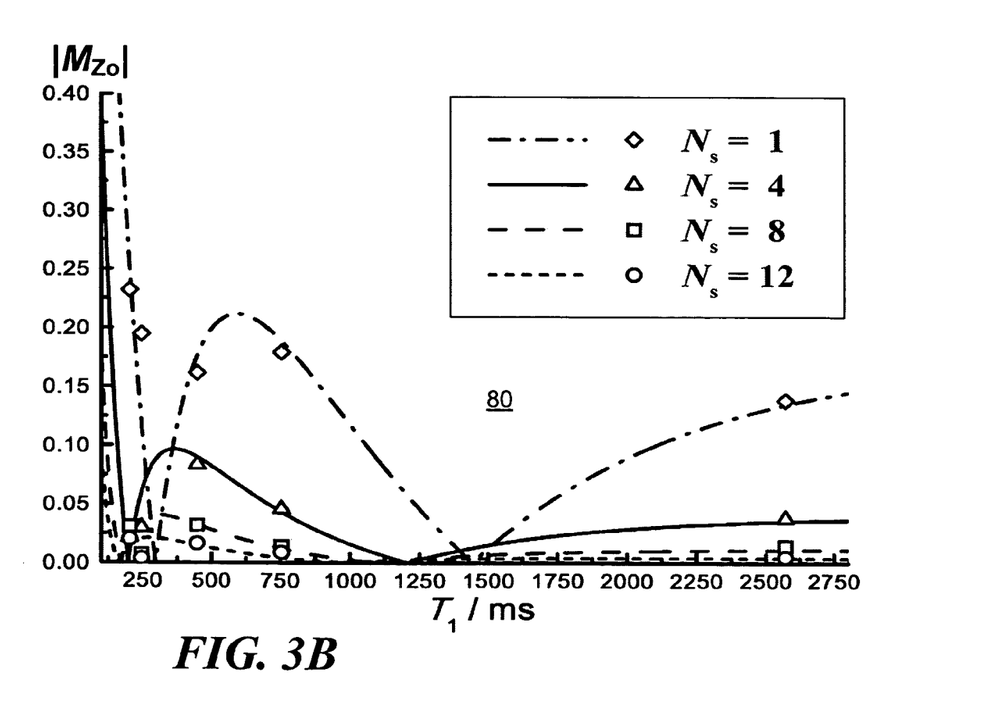

FIGS. 3A and 3B demonstrate general trends determining the effects of pulse sequence parameters on the outer volume suppression efficiency. Simulated and experimental results are superimposed on the same plots and demonstrate good agreement. The simulated curves 70 and 80 in FIGS. 3A and 3B, respectively, are plotted as absolute values of longitudinal magnetization to provide compatibility with experimental magnitude data. Experimental values were measured at the same parameters and normalized to the fully relaxed magnetization. In FIG. 3A, data are presented for the variable TR and corresponding optimal values of $TI_{1o}$ and $TI_{2o}$: $TR/TI_{1o}/TI_{2o}$=1000/416/112 ms (solid line and triangles), 750/314/95 ms (long-dash line and squares), and 500/202/71 ms (short-dash line and circles). In FIG. 3B, data are presented at a constant TR=4000 ms for variable number of slices $N_s$ and corresponding optimal values of $TI_{1o}$ and $TI_{2o}$: $N_s=1$, $TI_{1o}/TI_{2o}$ 1307/189 ms (dash-dot line and diamonds); $N_s=4$, $TI_{1o}/TI_{2o}$=564/107 ms (solid line and triangles); $N_s=8$, $TI_{1o}/TI_{2o}$=320/70 ms (long-dash line and squares); and $N_s=12$, $TI_{1o}/TI_{2o}$=224/51 ms (short-dash line and circles). Echo train parameters were N=8 (both FIGS. 3A and 3B) and $2\tau$=10.7 ms (FIG. 3A) or 7.9 ms (FIG. 3B). Experimental signal intensities in FIGS. 3A and 3B are normalized to the intensity obtained using the FSE sequence with the fully relaxed magnetization (TR=10,000 ms) and identical parameters of the echo readout. This normalization adjusts the measured values to the same scale as Eqs. [1] and [3]. Both simulations and experiments revealed that the key factors affecting performance of the sequence are TR (FIG. 3A) and the number of slices in the multislice mode (FIG. 3B). At a short TR, typical for $T_1$-weighted imaging (500-1000 ms), the outer volume signal can be effectively suppressed in a wide range of $T_1$ (FIG. 3A) using the single-slice SFQIR sequence. With an increase of TR, suppression becomes less efficient. Multislice SFQIR demonstrates an improvement in suppression with an increase of the number of slices (FIG. 3B). Thus, multislice imaging provides a natural solution of a poor suppression problem at a long TR, where single-slice imaging is also impractical due to scan time constraints.

Simulations of the blood signal were designed to compare blood suppression by the SFQIR sequence, optimized for the outer volume suppression, with the previously studied QIR sequence. As noted above, one significant difference between the two methods is that the inversion times in the QIR method are optimized for blood suppression in the specified range of $T_1$ values, while for SFQIR, optimal $TI_{1o}$ and $TI_{2o}$ result in generally suboptimal inversion times $TI_{1b}$ and $TI_{2b}$ for blood suppression. In a graph 90 shown in FIG. 4, the blood suppression effect across the range of $T_1$ values is compared for the SFQIR and QIR methods. All data correspond to single-slice acquisition with TR=800 ms.

Figure 4:
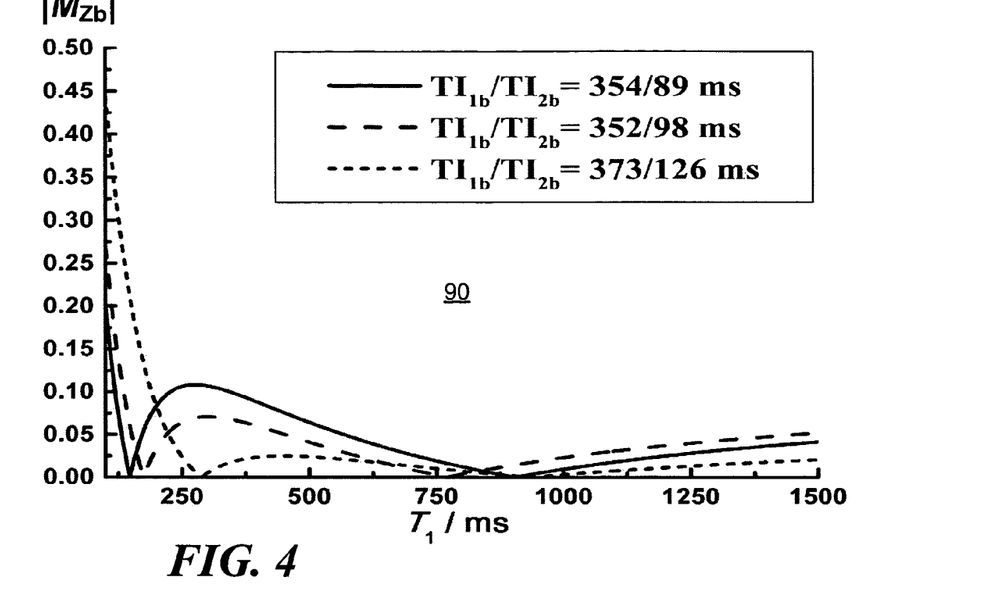
FIG. 4 illustrates simulations of blood suppression by the SFQIR-FSE sequence, wherein the absolute values of $M_{zb}$ values are plotted as functions of $T_1$.

Three combinations of parameters $TI_{1b}/TI_{2b}$ are compared as follows. In the first case, $TI_{1b}/TI_{2b}$=354/89 ms corresponding to optimal outer volume suppression with $TI_{1o}/TI_{2o}$=335/99 ms obtained by minimization of Eq. [5] with echo train parameters N=8 and 2τ10.7 ms (solid line); $TI_{1b}/TI_{2b}$=352/98 ms, the optimal solution for the QIR sequence with blood $T_1$ suppression range 100-1400 ms (long-dash line); and, $TI_{1b}/TI_{2b}$=373/126 ms, the optimal solution for the QIR sequence with blood $T_1$ suppression range 200-1400 ms (short-dash line). The optimal parameters of the QIR sequence were determined as described in the above-referenced commonly assigned copending U.S. patent application Ser. No. 10/740,354, filed on Dec. 18, 2003, and correspond to two arbitrarily chosen short-$T_1$ margins of acceptable suppression: 100 and 200 ms. Both QIR parameter sets were validated experimentally.

As a general trend, suboptimal $TI_{1b}$ and $TI_{2b}$ are manifested in the SFQIR sequence, so that the bump of the curve originating from negative magnetization values appears higher than that for the optimal QIR parameters. On the other hand, the residual magnetization is still low across the $T_1$ range (<10-12%) and even improved suppression is expected for SFQIR in the short $T_1$ region (below 200 ms). In the region of normal blood $T_1$ (~1200 ms), the suppression effect of SFQIR is similar to that of the original QIR method, as all curves are close to zero within 2-4% (FIG. 4). In practice, the noted minor differences in flow suppression by SFQIR and QIR are unlikely to produce a visible effect, since the simulated values of longitudinal magnetization reflect the maximal achievable blood signal rather than the actual one. Additional suppression mechanisms, such as flow de-phasing and the outflow between excitation and refocusing may further reduce the blood signal.

In vivo Applications

Figure 5:
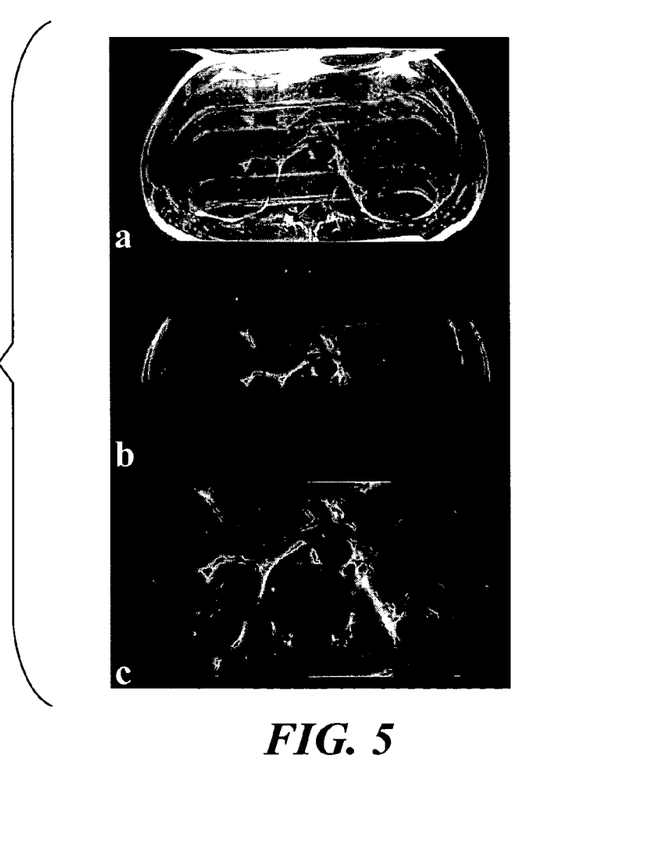
FIG. 5 illustrates imaging of the abdominal aorta with the SFQIR sequence.

FIG. 5 demonstrates the efficacy of outer volume suppression by SFQIR in vivo. Part a in FIG. 5 illustrates the reference $T_1$-weighted DIR-FSE image obtained with TR/TE=500/11.1 ms, echo train 8, matrix 256×128, FOV=32×16 cm², in-plane resolution 1.25×1.25 mm², slice thickness 4 mm, two signal averages, and acquisition time 17 s per slice. DIR black-blood preparation was applied with TI=224 ms. Part b of the Figure illustrates outer volume suppression by the SFQIR-FSE technique with the same parameters of the readout sequence. Optimal inversion times $TI_{1o}/TI_{2o}$=200/71 ms were found by minimization of Eq. [5]. Part c of FIG. 5 illustrates a reduced FOV (20×10 cm) SFQIR image with improved in-plane resolution (1.04×1.04 mm², matrix 192×96), three signal averages, and acquisition time 19 s per slice. All images were obtained with single-slice, non-gated, free-breathing acquisition. Imaging parameters between scans (part a) and (part c) in FIG. 5 were adjusted to keep close agreement between the acquisition time and SNR of each image. Transverse body images at the level of kidney and renal arteries were taken from a healthy subject. SFQIR completely eliminates a signal from the outer FOV areas, including a very strong fat signal adjacent to the surface coil, as seen in FIG. 5, parts a and b. FIG. 5, part c shows the potential of the SFQIR technique to improve image quality and resolution for imaging of vascular anatomy. This image is a clear, artifact-free picture of the aorta and adjacent vasculature.

An important observation derived from these images in FIG. 5 is that SFQIR is able to efficiently suppress motion artifacts originating from the abdominal wall. These artifacts considerably obscure the area of interest on the reference image (FIG. 5, part a), but completely disappear in the SFQIR image (FIG. 5, part c).

Figure 6:
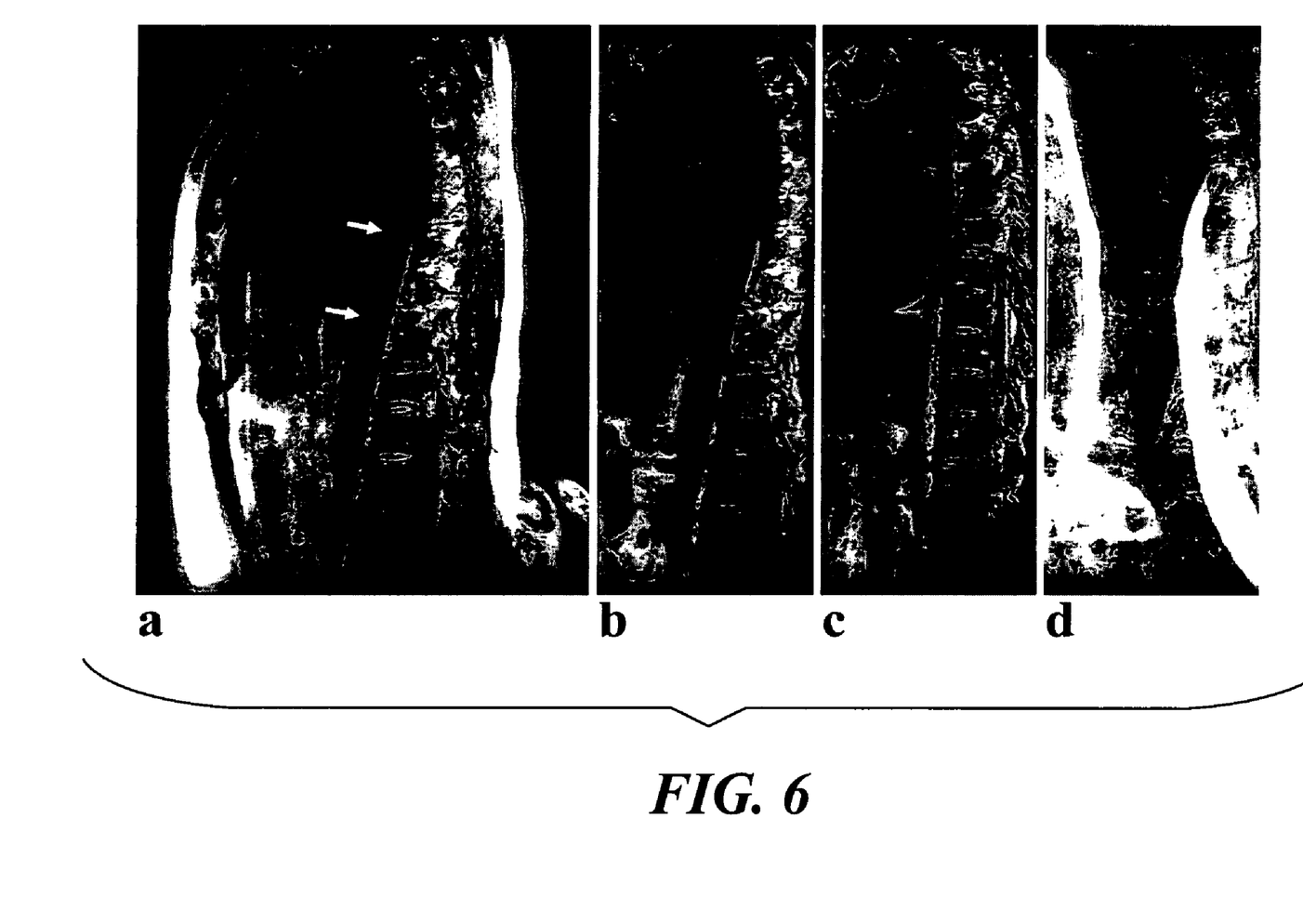
FIG. 6 illustrates a comparison of multislice DIR (in parts a and d) and multislice SFQIR (part b and c) techniques for black-blood 2-D MR angiography of the aorta.

FIG. 6 demonstrates the advantages of the multislice SFQIR technique for aorta imaging. For all images of this Figure, the parameters of the FSE readout sequence were TR/TE=6800/11.5 s, echo train 16, number of slices $N_s$=12, slice thickness 4 mm, in-plane resolution 0.94×1.41 mm², and two signal averages. The aorta is marked by arrows on the image (in part a of FIG. 6). All images of the Figure were obtained without respiratory triggering and cardiac gating. Part a of FIG. 6 illustrates the multislice DIR image obtained with 75% phase FOV acquisition (matrix 384×192, FOV 36×27 cm²), TI=250 ms corresponding to the zero-crossing point of blood signal, and an acquisition time of 3 min. and 38 s. Part b illustrates the multislice SFQIR image at the same location obtained with 37.5% phase FOV acquisition (matrix 384×96, FOV 36×13.5 cm²), $TI_{1o}/TI_{2o}$=270/86 ms, and an acquisition time of 2 min. and 16 s. Part c illustrates another cross-section from the image set (of part b) showing the spine and a fragment of the aortic arch. Part d illustrates aliasing artifacts occurring if 37.5% phase FOV acquisition is applied without outer volume suppression. The sequence for part d in FIG. 6 is the same as for the image in part a.

In the example shown in FIG. 6, the multislice DIR and SFQIR sequences were applied for black-blood oblique 2-D MR angiography (MRA) of the aorta, which is similar to an angiography application previously used by others for carotid artery imaging. The usefulness of such angiographic technique is motivated by its ability to obtain an extended longitudinal view of the vessel and thus, evaluate distribution of any lesions, without using a contrast agent. In vascular imaging, oblique black-blood MRA is routinely utilized for localization of internal landmarks, such as branching or bifurcations, which are used for precise positioning of the imaged volume in quantitative follow-up studies of atherosclerosis. A multislice DIR technique has been demonstrated to provide high-quality time-efficient acquisition for black-blood MRA of carotid arteries. However, an extension of this imaging approach to the aorta encountered difficulties caused by motion artifacts and poor flow suppression, as seen in FIG. 6, part a. The multislice SFQIR technique demonstrated marked improvements (FIG. 6, parts b and c), even with non-gated free-breathing acquisition, since the sequence eliminates the signal from the main areas responsible for artifacts, such as the heart and the chest wall. An improvement in blood suppression with SFQIR is likely to originate from bi-directional saturation of inflowing blood, which is applied to inflow directions orthogonal to the slice plane and to the phase encoding axis. In addition, SFQIR provided a substantial reduction of scan time with acquisition of as few as 37.5% of phase-encoding steps. Without SFQIR, the same acquisition parameters resulted in severe aliasing artifacts, as shown in FIG. 6, part d.

Figure 7:
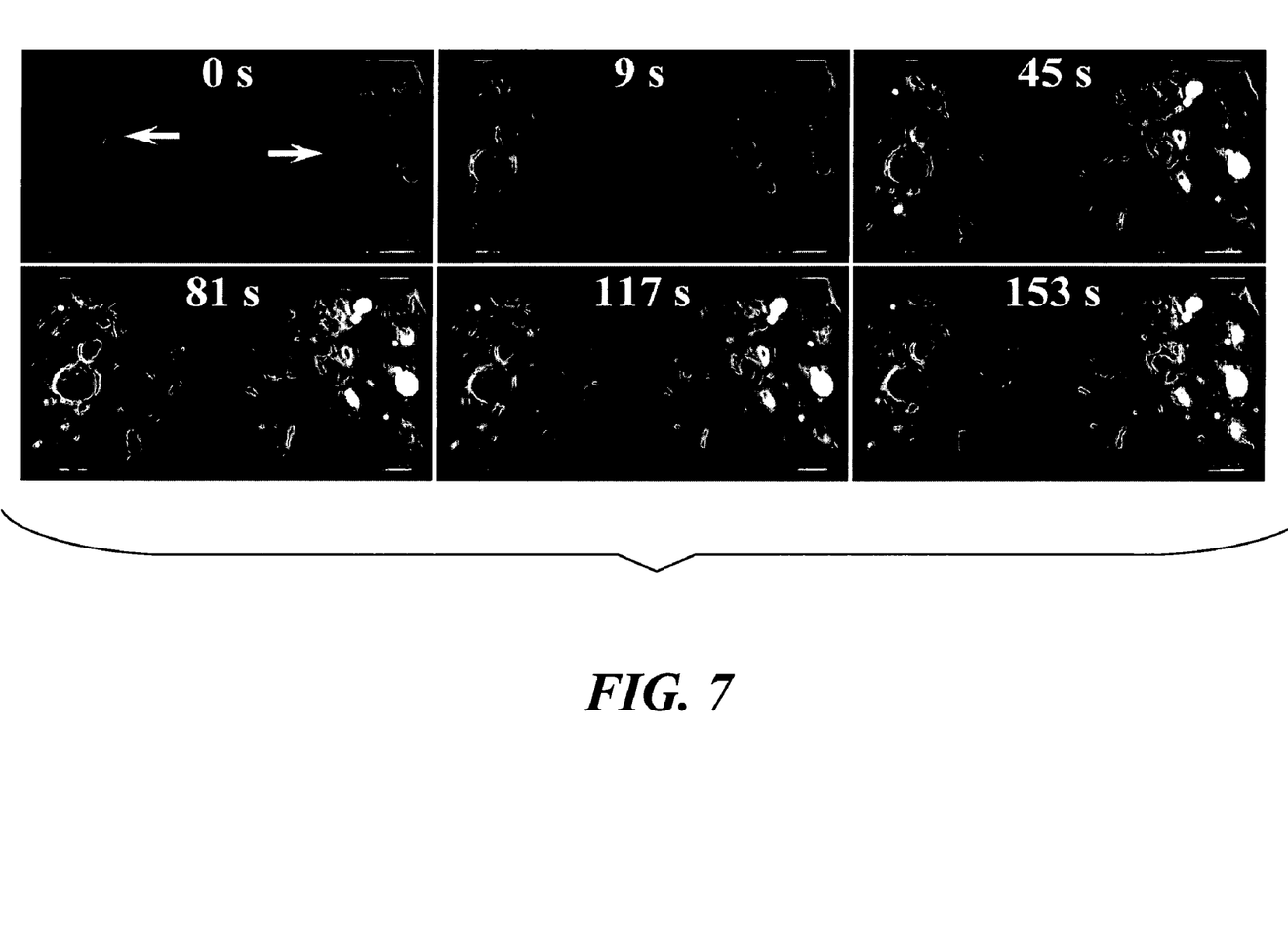
FIG. 7 illustrates black-blood dynamic contrast-enhanced SFQIR-FSE images of the carotid arteries obtained from a patient with advanced atherosclerosis.

FIG. 7 demonstrates a novel vascular imaging application of SFQIR, black-blood dynamic contrast-enhanced (DCE) imaging of the atherosclerotic plaque. Cross-sectional images of cervical carotid arteries were obtained from a patient with advanced carotid atherosclerosis. DCE images were consecutively acquired before and after the bolus injection of a gadolinium-based contrast agent (Omniscan™) in a dose of 0.1 mmol/kg of body weight with a temporal resolution of 9 s per slice. The parameters of the SFQIR-FSE imaging sequence were TR/TE=500/9.2 ms, echo train 10, $TI_{1o}/TI_{2o}$=199/71 ms, FOV=12×6 cm$^2$, matrix 192×80, in-plane resolution 0.63×0.75 mm$^2$, slice thickness 2 mm, and two signal averages. The total image set consisted of six time frames acquired at four locations in the sequential single-slice mode with acquisition time of 9 s per slice (36 s per frame). The images are shown for one location disposed at approximately 2-4 mm superior to both carotid bifurcations.

The numbers in each image of FIG. 7 indicate the time after contrast agent injection, where 0 s is for the pre-contrast scan. Arrows indicate atherosclerotic plaques, which encircle the right and left internal carotid arteries. The pre-contrast agent image shows large atherosclerotic plaques in both right- and left carotid arteries. In the frame acquired at 9 s after contrast agent injection, the lumen-wall boundary is obscured by the blood signal. According to the literature, this time point corresponds to the arrival time of the contrast agent bolus in the carotid arteries, and the peak concentration of the contrast agent results in an ultra-short $T_1$ of blood (<100 ms). The next frames in this Figure demonstrate the clear definition of the lumen and gradual non-uniform enhancement in bilateral atherosclerotic plaques. Except the first-pass time point (9 s), no flow artifacts are visible in the carotid arteries. The behavior of the blood signal in this experiment confirms the ability of SFQIR to provide suppression of contributions due to blood flow, in a wide range of $T_1$ similar to QIR and agrees with theoretical expectations (FIG. 4).

Discussion

The study described above demonstrated that the principle of quadruple-inversion recovery provides a natural extension to a general imaging approach, with suppression of unwanted signals from regions appearing out of the area of interest based upon optimal inversion times. The SFQIR method combines the ability to suppress either/both outer volume and inflowing blood using a single preparative sequence. These features make SFQIR the method of choice for a number of vascular applications, where the advantages of the method can be applied for eliminating motion artifacts, reducing scan time, and/or improving spatial resolution, and generally improve the overall quality of images achieved.

An important development of this work is the multislice design of the SFQIR sequence, which overcomes the single-slice nature of the initial QIR method. The multislice capability extends SFQIR applications to long-TR imaging and thus, enables the use of this technique in multi-contrast protocols for proton density- and T$_2$-weighted scans. The additional scan time reduction and artifact removal make multislice SFQIR a competitive technique for multi-spectral characterization of the vessel wall and atherosclerotic plaque as an alternative to previously described multislice QIR sequences.

The suppression efficiency of the SFQIR sequence depends on the repetition rate of the preparative quadruple-inversion block, which is determined by the sequence TR for single-slice acquisition. As shown by simulations and experiments, excellent suppression over a physiologically likely $T_1$ range can be obtained if TR does not exceed 700-800 ms. At a longer TR, suppression becomes more dependent on $T_1$. A potential solution of this problem would be an inclusion of extra double-inversion pulse pairs, similar to techniques used for inversion-based background suppression. Thus, it will be understood that the preparatory sequence need not be limited to only two pairs of pulses.

An alternative solution has been demonstrated by switching the sequence to the multislice mode for longer TR, which provides a more elegant way to achieve similar results with simultaneous improvement in time efficiency. However, insufficient suppression may be a limitation of the SFQIR technique if combined with 3-D sequences for long-TR acquisition (e.g., 3-D FSE or GRASE methods applied for proton density- and T$_2$-weighted imaging). For such specific applications, the SFQIR preparative scheme may need to be modified by introducing additional inversion pulses. For multislice SFQIR, the suppression efficiency is determined by the repetition time per slice, TR/$N_s$. A tradeoff in the choice of this parameter depends on two factors. An increase of the ratio TR/$N_s$ reduces suppression effect, while with a faster repetition of the SFQIR preparation (i.e., a shorter TR/$N_s$), unwanted saturation of an imaged region may result in degradation of image quality. Effects of DIR and QIR preparative sequences on stationary tissues were evaluated previously, and a generally non-negligible signal reduction was noticed for a multislice DIR sequence. Based on actual observations, in the practical design of SFQIR-based protocols, it is recommended that the value TR/$N_s$ be kept in the range from about 400 to about 800 ms, which provides a reasonable balance between the above adverse effects.

The SFQIR method has a common limitation with other techniques for reduced FOV imaging. This limitation is related to the fact that SNR is proportional to the square root of the number of phase-encoding steps, assuming that other imaging parameters are constant. Thus, a reduction of the FOV with the constant voxel size inevitably results in a reduced SNR. For that reason, SNR-demanding applications may not fully benefit from reduced FOV imaging, since extra signal averages may be needed to maintain acceptable SNR. On the other hand, even if a scan time reduction is unachievable due to SNR requirements, the SFQIR technique still can be beneficial as a way to reduce motion and flow artifacts, as seen in examples of aorta imaging shown in FIGS. 5 and 6, where SFQIR enabled non-gated free-breathing acquisition with diagnostic image quality.

In this study, an initial experiment has demonstrated black-blood dynamic contrast-enhanced imaging. It was recently shown that kinetic parameters derived from DCE in the carotid atherosclerotic plaque correlate with inflammatory activity, which is thought to be a valuable indicator of plaque instability and progression. An existing known technical approach for studying DCE in the plaque is based on a spoiled gradient-echo imaging sequence, which results in the strong blood signal in the lumen. This approach limits the ability of DCE imaging to discriminate enhancement in the juxtaluminal region, which is obscured by the blood signal. Meanwhile, information about contrast accumulation at the lumen-wall interface is of special interest, as it may be indicative of the inflammatory status of the fibrous cap and surface erosion. Thus, a technique with black-blood contrast would provide clear advantages for this area of research. Such a technique should also provide sufficient temporal resolution, which is difficult to achieve with the QIR sequence previously used. The SFQIR method enables black-blood DCE imaging due to its capability to suppress blood signal in a wide range of $T_1$ similar to QIR and improved temporal resolution. It is believed that SFQIR can be potentially beneficial for other contrast-enhanced perfusion studies due to its ability to remove or considerably reduce contributions from the flow in large vessels.

Examples of this study have demonstrated the advantages of the SFQIR method in vascular imaging. However, similar imaging approaches can be used in a variety of non-vascular applications. Imaging of the spine naturally benefits from the reduction of FOV in the phase-encoding direction, especially if additional goals such as prevention of flow and motion artifacts are achieved. As seen from FIG. 6, part c, the SFQIR-FSE sequence produces high-quality spine images. In this example, the oblique geometry was targeted to the aorta, but the spine is also clearly seen. In spinal protocols, SFQIR can be used for reducing scan time and motion artifacts similar to currently applied spatial pre-saturation, but with the better reliability that stems from the high performance of the method for tissues with short $T_1$ (e.g., fat) and low sensitivity to $B_1$. The SFQIR sequence is also expected to be useful for contrast-enhanced imaging of deeply positioned small anatomic structures (e.g., pituitary gland, prostate, and adrenal glands), where this method can deliver high resolution and effective suppression of flow artifacts.

Steps Used in Both QIR and SFQIR Pulse Sequences

Figure 8:
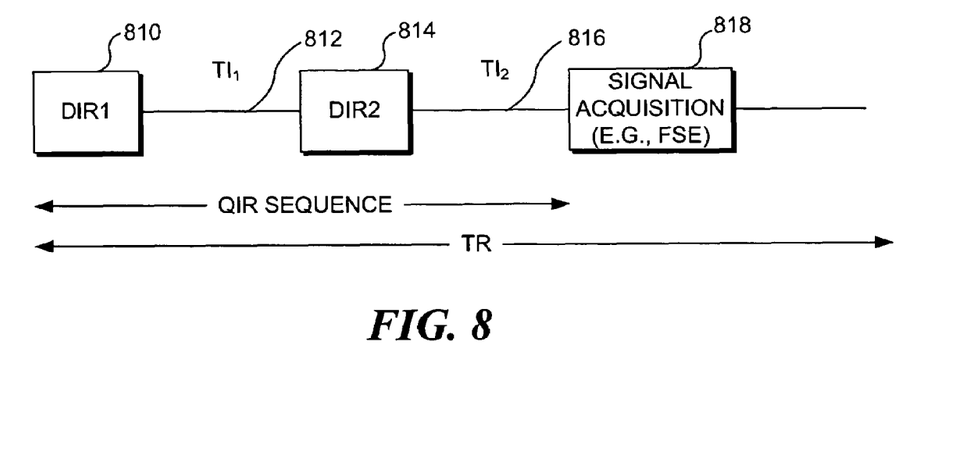
FIG. 8 is a timing diagram of the FSE-QIR sequence.

FIG. 8 illustrates the steps employed in both the QIR and SFQIR pulse sequences. As shown therein, a first double-inversion 810 is carried out, followed by a first inversion delay period, $TI_1$ which is identified by reference number 812. A second double-inversion 814 is then implemented, followed by a second inversion delay period, $TI_2$, which is identified by a reference number 816. A signal produced by the tissue being imaged is then acquired, for example, using an FSE pulse sequence, as indicated in a block 818. Inversion delays, $TI_1$ and $TI_2$, can be assigned to specific inversion times for the outer volume ($TI_{1o}/TI_{2o}$) or inflowing blood ($TI_{1b}/TI_{2b}$) depending on a particular configuration of the inversion pulses used, as was previously exemplified in FIG. 1. Generally, as noted above, any 2-D or 3-D acquisition sequence can be used to produce signal excitation and spatial encoding instead of the FSE pulse sequence employed in this exemplary process.

In each double-inversion procedure, a slice-selective inversion RF pulse is applied in rapid succession either before or after another inversion RF pulse, which can be non-selective, as in the QIR design, or transversely oriented slab-selective, as in the SFQIR design. Also, it should be noted that adiabatic pulses can be used for either the selective or the nonselective inversion in order to reduce phase errors of magnetization across the object. The thickness of the re-inverted slice is generally greater (1.5-3 times) than the thickness of the imaged slice in order to avoid displacement effects caused by breathing and heart pulsation. The slice-selective pulse can be applied to a single slice, or a group of slices, or a three-dimensional slab depending on the acquisition method (2-D single-slice or multislice, or 3-D). If the first and second inversion delay periods, $TI_1$ and $TI_2$ are properly selected, the longitudinal magnetization of either the outer volume or inflowing blood should approach zero after the second inversion delay period, $TI_2$. While the first and second inversion delay periods can be mathematically calculated as discussed above, it is also possible to empirically determine each of the inversion delay periods using graphical methods.

A test of the QIR approach disclosed in commonly assigned copending U.S. patent application Ser. No. 10/740, 354, which is the parent of this application, confirmed its ability to provide improved black-blood imaging after an injection of the contrast enhancement agent. A series of tests of the SFQIR approach disclosed herein has demonstrated that the SFQIR method can be used similarly to QIR for blood suppression and provides an additional useful feature by its ability to suppress the signal from the outer volume of tissue. As noted in regard to the approach described in the earlier copending application, both the QIR and SFQIR pulse sequences can be implemented with two timing options. In the first option, the TR or sequence time is fixed and defined by the operator as appropriate for the imaging system being used. In the first option, the TR or sequence time is fixed and defined by the operator as appropriate for the imaging system being used. In the second option, the execution of the sequence is synchronized with the cardiac rhythm of the patient, so that the TR is equal to one or more cardiac intervals (R-to-R). This cardiac-gated acquisition mode is useful for imaging anatomic locations affected by heart pulsation, such as the heart or the aorta. In the tests demonstrating the efficacy of the QIR and SFQIR pulse sequences, these sequences were implemented with adiabatic hyperbolic-secant RF pulses applied for selective inversions. However, other pulse shapes can be used to achieve spatially selective or non-selective inversion of magnetization.

Figure 9:
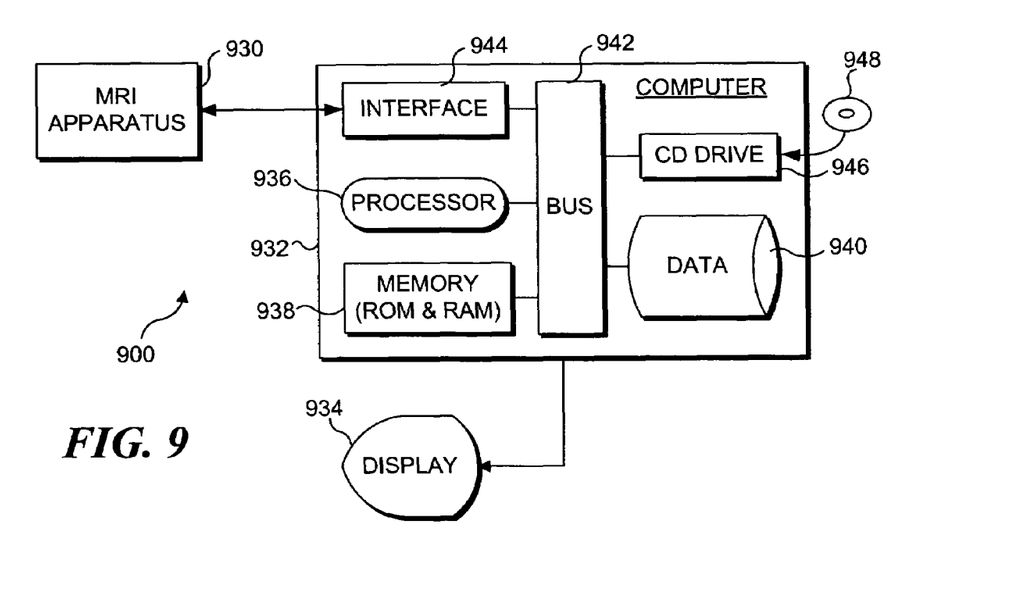
FIG. 9 is a schematic block diagram showing a computer coupled to an MRI apparatus, for practicing the present invention.

FIG. 9 schematically illustrates a system 900 for implementing the present approach, and this system is also described in the parent patent application noted above. The system includes a generally conventional MRI apparatus 930 that is controlled by a computer 932. Computer 932 may be a generally conventional personal computer (PC) or a dedicated controller specifically intended for controlling MRI apparatus 930. Although not specifically shown, MRI apparatus 930 includes a magnet to create a permanent magnetic field, a plurality of gradient coils to produce spatial variations of the magnetic field, and a radio frequency (RF) transmitter and receiver to respectively transmit and receive RF signals to and from a plurality of RF coils, as will be well known to those of ordinary skill in the art of MRI. Accordingly, these and other details of the MRI apparatus need not be specifically illustrated or further discussed herein to enable the present approach.

Computer 932 is coupled to a display 934, which is used for displaying MRI images to an operator. Included within computer 932 is a processor 936. A memory 938 with both read only memory (ROM) and random access memory (RAM), a storage 940 (such as a hard drive or other non-volatile data storage device) for storage of data and software programs, an interface 944, and a compact disk (CD) drive 946 are coupled to processor 936 through a bus 942. CD drive 946 can read a CD 948 on which machine instructions are stored for implementing the present invention, as well as other software modules and programs that may be run by computer 932. The machine instructions are loaded into memory 938 before being executed by processor 936 to carry out the steps of the present invention. Preferably, also stored in memory will be the predefined optimal inversion times that are to be applied to suppress the signal from the outer volume of tissue or from blood flowing through the site, as discussed above.

Operation of MRI apparatus 930 is controlled by computer 932 when processor 936 executes the machine instructions stored in memory 938. These machine instructions cause the processor to implement the approach discussed above. The resulting images are displayed on display 934 using data stored in storage 940 to enable further processing. It is also noted that the machine instructions will cause processor 936 to carry out the calculation needed to implement this technique, i.e., to predetermine the optimal delay times for inversion, as described above.

CONCLUSIONS

This study introduced a new pulse sequence for reduced FOV imaging, which employs a principle of multiple-inversion recovery. The SFQIR technique demonstrated robust performance and can be used in various imaging applications, where a restriction of FOV is beneficial for a reduction of scan time, increase of spatial resolution, and elimination of motion artifacts. An important advantage of SFQIR is its ability to simultaneously suppress the signal from inflowing blood, which makes this technique especially useful for cardiovascular imaging. Finally, the SFQIR technique offers a promising potential for imaging in high magnetic fields, because of its insensitivity to $B_1$ variations resulting from the use of adiabatic inversion pulses.

Although the present concept has been described in connection with the preferred form of practicing it and modifications thereto, those of ordinary skill in the art will understand that many other modifications can be made within the scope of the claims that follow. Accordingly, it is not intended that the scope of the present novel approach in any way be limited by the above description, but instead be determined entirely by reference to the claims that follow.

The invention in which an exclusive right is claimed is defined by the following:

1. A method for simultaneous suppression of components of a magnetic resonance signal used for imaging a site in a subject, said components corresponding to both portions of the site disposed outside an imaged field of view, and blood flowing through the site, comprising the steps of:
   (a) using a magnetic resonance imaging device, generating a preparative sequence of inversion radiofrequency (RF) pulses prior to executing an imaging acquisition, a total number of the RF pulses being an even number at least equal to four;
   (b) applying said RF pulses to the subject so that the RF pulses are grouped into a plurality of double-inversion procedures, each double-inversion procedure including a first selective RF pulse executed synchronously with a magnetic field gradient pulse targeted to select a first volume and a second selective RF pulse executed synchronously with a magnetic field gradient pulse targeted to select a second volume that crosses and is generally transverse to the first volume, wherein the first and second selective RF pulses in each double-inversion procedure are immediately adjacent to each other in time such that each double inversion procedure causes a zero-degree rotation of a magnetization of a crossing portion of the first volume and the second volume and a 180-degree rotation of a magnetization of a remainder of each volume, both of said magnetizations being substantially aligned along a direction of the magnetic field so that no transverse components of the magnetizations are present;
   (c) applying a first predefined time delay between one of the first and second selective RF pulses in one procedure and a corresponding one of the first and second selective RF pulses in a successive double-inversion procedure; and
   (d) for a double-inversion procedure selected to be a last double-inversion procedure before the signal used to produce an image is acquired, applying a second predefined time delay following the corresponding one of the first and the second selective RF pulses, before acquiring the signal that will be processed to produce the image of the site, such that the longitudinal magnetizations from the portions of the site disposed outside of the imaged field of view and from the flowing blood are substantially suppressed when producing the image of the site as a result of applying the sequence of RF pulses that includes the first predefined time delay and the second predefined time delay.

2. The method of claim 1, wherein durations of the first predefined time delay and the second predefined time delay are optimized to provide a maximum suppression of one of:
   (a) a contribution due to flowing blood at the site; and
   (b) a contribution due to tissue that is outside a desired region to be imaged at the site.

3. The method of claim 2, wherein the other of the contribution to the signal due to flowing blood at the site, and the contribution to the signal due to tissue that is outside a desired region to be imaged at the site, is also substantially reduced.

4. The method of claim 1, wherein the first selective RF pulses are employed to select a slab at the site, the slab comprising the first volume.

5. The method of claim 4, wherein the second selective RF pulses are employed to select a slice at the site, the slice comprising the second volume.

6. The method of claim 4, wherein the second selective RF pulses are employed to select a plurality of slices included in another slab at the site, said other slab comprising the second volume.

7. The method of claim 1, wherein the first volume and the second volume are generally orthogonal to each other.

8. The method of claim 1, further comprising the step of determining durations of the first and the second predefined time delays by applying an optimization algorithm over a range of relaxation times $T_1$ for tissues at the site being imaged.

9. The method of claim 8, wherein the step of determining the durations comprises the step of employing a Gauss-Newton minimization technique in a reiterative process.

10. The method of claim 1, wherein producing the image of the site, using the signal from which undesired components of the signal have been removed, also derives at least one of the following benefits:
   (a) suppresses undesired artifacts in the image;
   (b) increases a resolution of the image; and
   (c) decreases a time required to scan the site and produce the image for display.

11. A memory medium storing machine instructions for carrying out the steps of claim 1.

12. A method for magnetic resonance imaging a site in a body of a subject so that contributions to an image of the site from both tissue that is outside a desired region to be imaged at the site and from blood flowing through the site are substantially and simultaneously reduced, comprising the steps of:
   (a) using a magnetic resonance imaging device, generating at least two pairs of preparative radio frequency (RF) inversion pulses synchronously with corresponding pairs of magnetic field gradient pulses, each pair of RF pulses causing a double-inversion of the magnetization at the desired region, said at least two pairs of preparative radio frequency inversion pulses occurring before acquiring an image of the site;

(b) applying the at least two pairs of inversion RF pulses to the subject as a preparative sequence of RF pulses executed prior to acquiring a signal usable for imaging the desired region, one RF pulse of each pair of RF pulses being targeted to select a first volume and the other RF pulse of each pair being targeted to select a second volume, wherein the first and second volumes extend generally transversely to each other, in a crossing relationship, such that each pair of RF inversion pulses and corresponding pair of magnetic field gradient pulses comprise a double inversion procedure that causes a zero-degree rotation of a magnetization of a crossing portion of the first volume and the second volume and a 180-degree rotation of a magnetization of a remainder of each volume, both of said magnetizations being substantially aligned along a direction of the magnetic field so that no transverse components of the magnetizations are present;

(c) applying a first time delay that was previously determined, between the RF pulses targeted at one of the first and second volumes occurring in successive pairs of the RF pulses; and (d) applying a second time delay following the RF pulse targeted at the one of the first and second volumes in a last pair of RF pulses during the preparative sequence, before acquiring the signal for processing to produce the image of the site, the contributions to the image of the site from the tissue that is outside a desired region and from blood flowing through the site being substantially suppressed when the signal is used to produce the image of the site, as a result of thus executing the preparative sequence.

13. The method of claim 12, further comprising the step of employing an even number of pairs of the RF pulses that occur within a repetition time being used for imaging the site.

14. The method of claim 12, wherein the first volume comprises a slab of tissue.

15. The method of claim 14, wherein the second volume comprises a slice of tissue that is substantially thinner in cross-section than the slab of tissue.

16. The method of claim 14, wherein the second volume comprises a slab of tissue that itself comprises a plurality of slices of tissue, any slice of which can be selectively imaged using the signal that was acquired.

17. The method of claim 16, further comprising the step of using the signal that was acquired to produce one of a plurality of images of selected slices from within the slab that comprises the plurality of slices, the signal that is processed to produce each image of the plurality of images being acquired after one RF pulse in the last of a pair of the RF pulses in each of a plurality of subsets of the pairs of RF pulses, where each subset of the pairs of RF pulses comprises a preparative sequence for each of the plurality of images.

18. The method of claim 12, wherein durations of the first and the second time delays are predetermined by minimizing a function that is defined for a range of relaxation times $T_1$ that is physiologically consistent with a variety of tissues at the site being imaged.

19. The method of claim 12, wherein a contribution to an image of the site from blood flowing through the site is also substantially reduced.

20. The method of claim 12, further comprising the step of predetermining durations of the first and the second time delays so as to substantially suppress a contribution to an image of the site, due to blood flowing through the site, while also substantially reducing the contribution to the image, due to the tissue that is outside the desired region.

21. The method of claim 12, wherein the first volume is generally orthogonal to the second volume, in forming the crossing relationship.

* * * * *